United States Patent
Harchanko et al.

(10) Patent No.: US 6,875,695 B2
(45) Date of Patent: Apr. 5, 2005

(54) SYSTEM AND METHOD FOR ANALOG REPLICATION OF MICRODEVICES HAVING A DESIRED SURFACE CONTOUR

(75) Inventors: John S. Harchanko, New Market, AL (US); Michele Banish, Huntsville, AL (US)

(73) Assignee: Mems Optical Inc., Huntsville, AL (US)

(*) Notice: Subject to any disclaimer, the term of this patent is extended or adjusted under 35 U.S.C. 154(b) by 45 days.

(21) Appl. No.: 10/115,992

(22) Filed: Apr. 5, 2002

(65) Prior Publication Data

US 2003/0190803 A1 Oct. 9, 2003

(51) Int. Cl.[7] .............................................. H01L 21/302
(52) U.S. Cl. ........................ 438/689; 438/725; 216/44
(58) Field of Search ............................ 216/44; 438/706, 438/716, 689, 725, 745

(56) References Cited

U.S. PATENT DOCUMENTS

| | | |
|---|---|---|
| 4,845,310 A * | 7/1989 | Postupack ................. 174/35 R |
| 5,310,623 A | 5/1994 | Gal |
| 5,512,131 A | 4/1996 | Kumar et al. |
| 5,575,878 A | 11/1996 | Cox et al. |
| 5,772,905 A * | 6/1998 | Chou ........................... 216/44 |
| 6,027,595 A | 2/2000 | Suleski |
| 6,277,666 B1 | 8/2001 | Hays et al. |
| 6,288,998 B1 * | 9/2001 | Taira ....................... 369/275.4 |
| 6,309,580 B1 * | 10/2001 | Chou .......................... 264/338 |
| 6,410,213 B1 * | 6/2002 | Raguin et al. ............. 430/321 |
| 6,586,327 B2 * | 7/2003 | Shepard ..................... 438/626 |

* cited by examiner

*Primary Examiner*—Kin-Chan Chen
(74) *Attorney, Agent, or Firm*—Keady, Olds, Maier & Richardson PLLC

(57) ABSTRACT

A master wafer is replicated by creating a mold by plating a nickel electroform on a surface of a silicon wafer. Thereafter, a child wafer is prepared with a layer of photoresist or similar material that is compatible with plasma-etching techniques. Thereafter, the mold shape is transferred to the photoresist through compression molding, thereafter the child wafer is etched.

16 Claims, 3 Drawing Sheets

SYSTEM AND METHOD FOR ANALOG REPLICATION OF MICRODEVICES HAVING A DESIRED SURFACE CONTOUR

BACKGROUND OF THE INVENTION

1. Field of the Invention

This invention relates generally to a replication technique for use in reproducing surface contours in devices, such as microdevices. Specifically, the present invention is directed to a method of making a master wafer whereby the master wafer is replicated and used to produce hi-fidelity copies.

2. Description of Related Art

Conventional gray scale etching processes enable the creation of various shapes and curves, both symmetric and asymmetric, thereby lending itself well for the use in fabrication of micro-optical systems. Traditional binary optics, such as RIE (Reactive Ion Etching) and DRIE (Deep Reactive Ion Etching) utilizes step etches which are used to approximate a smooth curve. However, gray scale etching processes can actually create smooth curves such as smooth ramps, lens, torroids, turbo machines, gears, and other complex shapes.

The utilization of gray scale optics in the formation of products such as microlenses is typified in U.S. Pat. No. 5,310,623 to Gal., for example. In particular, the Gal patent pertains to a microlens replica formed in the photoresist material with a gray scale mask of a selected wavelength (usually in the UV), and the material replica is subsequently used to reproduce the replica directly in the substrate by differential ion milling.

Differential ion milling entails shooting a stream of argon atoms at the substrate, which is often considered to be analogous to sandblasting. As a result, differential ion milling is amenable to the formation of curved micro-structures. However, differential ion milling has the disadvantage of not being able to readily perform the deep etching necessary to form the structures necessary for micro-lenses or turbine rotors.

Standard gray scale techniques, such as that of Gal, allow the etching of shallow (<100 $\mu$m) structures, but have the disadvantage of needing thick layers of photoresist, wherein approximately 20 $\mu$m layer of photoresist is required to produce a 100 $\mu$m structure, for example. The gray scale lithography process may also be used to produce improved molds for producing micro-optical elements. The gray scale lithography process offers smoother curves and more flexibility in the heights and depths that may be formed in the substrate than those offered by conventional techniques.

Consequently, the optical elements produced by this process also exhibit improved characteristics both in surface finish and other characteristics of the finished optical elements.

The gray scale lithography process uses a gray scale mask to pattern a photoresist on a substrate, which is subsequently etched to form curved shapes. Patterning the photoresist to form a photomask layer can be performed using a single gray scale mask. Alternatively, patterning the photoresist to produce a variable thickness photomask layer can be accomplished by exposure with 2 gray scale masks.

By using an appropriate pattern, an exposure in a photoresist material can be created which will cause the height of the processed photoresist material to replicate the height of the desired workpiece. The exposed photoresist can then be processed using known methods to produce an impression of the desired pattern in the developed photoresist. Alternatively, the patterned photoresist itself can be the final product.

The image impression in the photoresist is produced by exposing the photoresist material to light of a selected wavelength through the gray scale mask, transmitted through openings in the exposure mask for a selected time period. The light is usually ultraviolet light. The exposed photoresist material is subsequently processed to procure the desired object on a substrate material using an etching method such as RIE (Reactive Ion Etching) or DRIE (Deep Reactive Ion Etching).

Gray scale mask technologies, including the half tone process, the modulated exposure masking technique and Canyon Material's High Energy Beam Sensitive (HEBS) glass, can be used to imprint the photoresist. These techniques partially expose a photosensitive material to achieve a desired structure. Photosensitive materials include, but are not limited to, photoresist and PMMA (polymethyl methacrylate) materials. When using HEBS, the glass itself is photosensitive.

High Energy Beam Sensitive (HEBS) glass is a one step fabrication of a gray level mask. The exposure of this gray level mask is done using an e-beam writing tool. The e-beam writing tool software is used to support mask making and direct write-on resist approaches for the fabrication of diffractive optical elements (DOEs). The so-generated gray level mask is usable in an optical exposure tool (e.g., a G-line stepper, or a contact printer) to mass fabricate resist profiles.

Using the HEBS-glass gray level mask fabrication and a following optical exposure, alignment errors are possibly avoided, since the mask is written in a single step using different electron beam dosages to generate gray levels. Instead of fabricating of a set of five binary masks with all the involved resist processing and wet etching, only a single writing step without any resist processing is used. This single mask then contains all the necessary information previously contained in a set of five binary chrome masks.

After the HEBS gray level mask is fabricated a series of single exposures in a step-and-repeat system can generate hundreds of DOEs on the same wafer. This wafer can then be processed to transfer the DOE structure of a large number of different elements into the substrate. Since the complete DOE structure is transferred into the substrate there is no need for a resist stripping step after the etching process. After dicing the wafer, many of monolithic multilevel DOEs have been generated.

However, there are at least two main sources of errors that plague the surface profile of structures, in photosensitive materials, resulting from a gray scale or analog lithography process.

The first source of error arises from general roughness in the surface of the photosensitive material. This error may be caused by the slight variations in the dose of the writing tool, usually an electron beam (e-beam) or laser. In the case of the half tone process, the chosen pixel shape scheme may cause this error. The period of oscillation for the general roughness error is typically on the order of 10 microns.

The second source error is the stitching error, i.e., it is geometric and is induced by slight variations in the positioning and size of the writing tool. Stitching error is due to slight inaccuracies of the stage and field of the writing tool. The stage of the writing tool refers to the horizontal sweep, wherein slight variation in the positioning of the horizontal line results in stitching error. The field refers to the width of the writing line, wherein variation in the width of the writing line also results in stitching error. The stitching error is of low frequency period and manifests itself in the slight vertical lines in the surface In other situations, typically, several wafers are used in order to develop a manufacturing process usable to obtain desired surface characteristics on a series of wafers, including a desired surface shape, surface roughness, wafer uniformity, focal length tolerance, etc. However, once a first wafer is processed, only the general parameters for the process are established. As a drift occurs in the process, i.e., as a result of etching, the parameters must be re-adjusted to compensate for the drift. This requires that several more wafers be processed to determine the new parameters and produce objects with the desired features.

Unfortunately, the patterning process also drifts and the associated parameters must be adjusted to compensate for this drift. The combination of etching and patterning process variants unfortunately translates into extremely low yield. For this reason, for customers requiring high-volume, the issues of cost, consistency, and quality become significant.

Hence, there is a need to provide a first wafer that meets all requirements and designate such a wafer as a "master" whereby the master wafer will be replicated and used to produce copies.

SUMMARY OF THE INVENTION

The present invention has been developed with the view toward substantially reducing the need to adjust parameters related to a drift in the associated processes. The present invention is therefore directed to a method of creating analog replicas of a master wafer whereby the master wafer meets all requirements. Thereafter, the master wafer is used to make high-fidelity copies, i.e., child wafers.

It is an object of the present invention to provide analog replication techniques using photoresist. The photoresist can be a positive or negative photoresist. The positive photoresist material can be a novalak or phenyl-formaldehyde resin. The negative photoresist materiel can be a polyimide. Epoxy based negative resists have been used in MEMS processing. A preferred photoresist is a positive novalak photoresist or similar material that is compatible with plasma-etching techniques. The specific type of photoresist is selected for, among other characteristics, the desired depth of the photoresist layer. Other suitable materials may be substituted and the discussion herein should not be interpreted to limit the invention.

It is further an object of the present invention to create replicated structures on a wafer level. The substrate material used for the wafer is preferably silicon. However, the substrate may be selected from any number of materials, which can be silicon, GaAs, plastic, glass, quartz, ceramics or metals such Cu, Al and Ge. Other suitable materials may be substituted and the discussion herein should not be interpreted to limit the invention.

These and other objects may be realized by a method of making an analog replica of a master wafer including the steps of creating a mold by electroforming a layer of material on the surface of a substrate, preparing a child wafer with a layer of photoresist, transferring the mold shape to the photoresist, separating the mold from the child wafer, and etching the child wafer.

The electroforming step includes electroforming a layer of nickel on the surface of the substrate. The electroformed nickel thereafter acting as a mold of the master wafer.

The method of making an analog replica of a master can further include applying a release-aid layer prior to electroforming, if necessary, for allowing the master wafer to easily separate from the nickel electroform.

Once the mold and child wafer are separated, the method includes applying standard plasma etching techniques to the child wafer. Preferably, each child wafer is produced using the mold so that each child wafer has exactly the same photoresist shape as each other child wafer.

BRIEF DESCRIPTION OF THE DRAWINGS

Exemplary embodiments of the invention will be described in detail, with reference to the following figures, wherein.

DETAILED DESCRIPTION OF PREFERRED EMBODIMENTS

Figure 1:
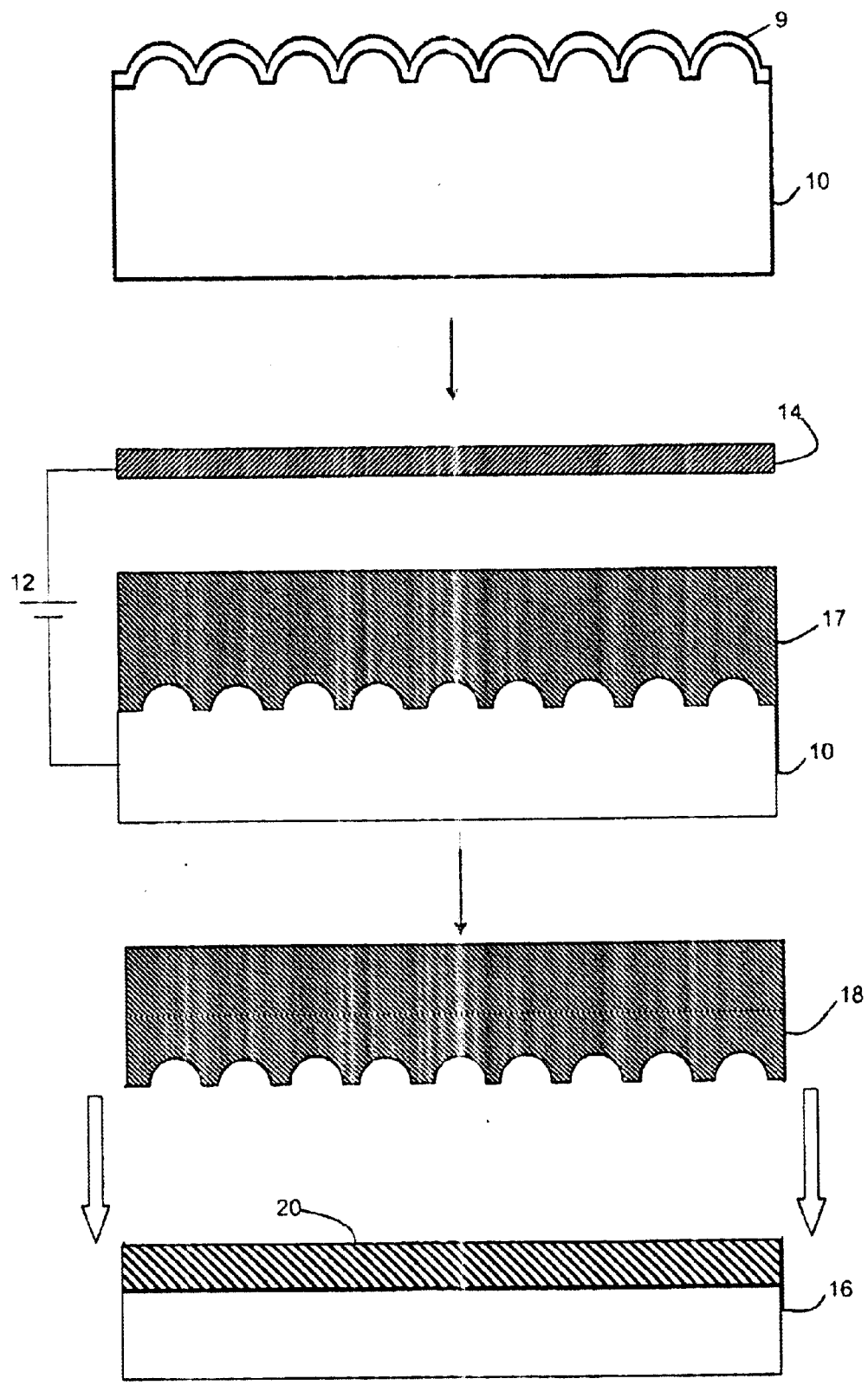
FIG. 1 illustrates the replication process in accordance with the systems and methods of the present invention.

For a general understanding of the features of the present invention, references is made to the drawings, wherein like reference numerals have been used throughout to identify identical or similar elements. While the present invention will be described in terms of an illustrative embodiment or embodiments, it will be understood that the invention is adaptable to a variety of analog replication techniques, such that the present invention is not necessarily limited to the particular embodiment or embodiments shown and described herein. To the contrary, the following description is intended to cover all alternatives, modification, and equivalents, as may be included within the spirit and scope of the invention.

In an exemplary embodiment of the master wafer replication technique, as shown in FIG. 1, initially a master wafer 10 is formed using MEMS Optical standard gray scale techniques, for example. However, other types of techniques for making MEMS may also be used, such as binary techniques and holograph techniques. However, standard gray scale techniques allow the etching of shallow curved structures of a magnitude of less than 100 $\mu$m using an etch method such as ion milling with argon.

element can be 0.2 $\mu$m on each side. The exposing light is uv light of 0.3 $\mu$m wavelength. The resolution elements can be arranged in groups so as to enable a full wavelength of the uv light to pass through an opening formed by the aligned resolution elements. Infrared light exposure is used with a 128 shade gray scale. However, uv light is preferably used with a 9000 shade gray scale.

Thereafter, patterning the photoresist to form a photomask layer can be performed using a single gray scale mask. Alternatively, patterning the photoresist to produce a variable thickness photomask layer can be accomplished by exposing with 2 or more gray scale masks.

By using an appropriate pattern, an exposure in a photoresist material can be created which will cause the height of the processed photoresist material to replicate the height of the desired workpiece. The exposed photoresist can then be processed by developing using known methods to produce an impression of the desired pattern in the developed photoresist.

The image is produced by exposing the photoresist material to light of a selected wavelength through the gray scale mask, transmitted through openings in the exposure mask for a selected time period. The light is usually ultraviolet light. The exposed photoresist material is subsequently processed to procure the desired object on a substrate material using an etching method such as ICP-machining or RIE/ICP-machining.

For standard RIE etching of grayscale photoresist structures, the choice of process gases is dependent on the material being etched. For silicon, $SF_6$ and $O_2$ are typically used, although other gases can and are used depending of the application. Other process gases used include, but are not limited to $CF_4$ and $CHF_3$, which can also be mixed with $O_2$. The variation of process parameters allows a desired selectivity for the etch. Selectivity is defined as the etch rate of the photoresist versus the etch rate of the substrate. The ICP-machining method permits an etching rate of between 2 and 20 $\mu$m/min and a polymer layer that can be an approximately 50 nm thick TEFLON-like polymer (polytetrafluoroethylene-like polymer) layer. The polymerization step can be performed using a mixture of Ar and $CHF_3$. The etching step can be performed for a sufficient duration to attain an etching depth of approximately 2–3 $\mu$m. The ICP-machining method uses a plasma that can be generated using microwave energy at outputs between 300 and 1200W (2.45 GHz). During the etching steps, an ion bombardment with energies between 5 and 30 eV can be used so as to have the structure base completely free form deposits from the plasma.

Once the master wafer 10 is formed, the method of the present invention fabricates a mold 18 that is used to replicate the master wafer. For example, using the master wafer formed by standard gray scale techniques, for example, the master wafer 10 is electroformed 17 using nickel or copper or any other suitable metallic material to a sufficient thickness. The electroforming process can either include using a voltage source 12 connected to a nickel source 14 and the master wafer 10 wherein nickel is electroformed onto the surface of the master wafer 10 or by immersing (not shown) the master wafer 10 into a tank of dielectric solution wherein a current is ran through a connected anode or cathode and the desired metal is plated onto the master wafer. The electroforming process can also be substituted by a standard metal coating procedure, a low pressure metal evaporation procedure, or any other similar techniques.

Figure 2:
FIG. 2 illustrates the different types of surface shapes of the master wafer.
Figure 2:
Figure 2:
Figure 2:
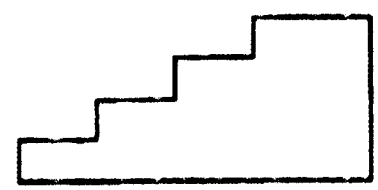
Figure 2:
Figure 2:
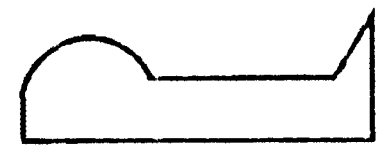

The nickel source 14 works to produce a layer of nickel on the surface of the master wafer 10. The area where the nickel first touches the master wafer 10 forms the shape exhibited by the master wafer 10. The processes set forth in the present application is appropriate for a master wafer 10 having surface shapes including any of a convex, a concave, linear slopes, and binary step structures and any combination of these fundamental structures, as shown in FIG. 2.

However, if an additional layer is required for allowing the master wafer 10 to easily separate from the nickel electroform 18, this additional release-aid layer 9 should be applied before the electroform process.

Examples of such release-aid layers that can be used in the process include any metal that would have poor adhesion to the silicon, such as gold, or a standard mold-release, such as Teflon.

However, if the release-aid layer 9 is made of a metal, other metals can be deposited on top of the release-aid layer in order to improve the adhesion of the release-aid layer 9 to the nickel electroform 18. In any case, the release-aid layer 9 should be chosen so as to minimize any replication errors, such as increased surface roughness or other undesirable effects.

While the nickel is being electroformed 17, the stress of the nickel layer on the master wafer 10 can be monitored and controlled (not shown)in order to provide near-zero residual bulk stress in the nickel layer. The monitoring and controlling will allow the electroformed nickel mold 18 to keep its gross shape once released from the master wafer 10. Monitoring and controlling of the stress of the nickel layer can be accomplished externally by using any commercially available stress monitoring process currently being used by electroformers.

Once the electroforming process is completed and the electroformed nickel mold 18 is fabricated, the mold 18 is used to create replicas of the master wafer 10.

In creating replicas of the master wafer 10, first a child wafer 16 is prepared with a layer of photoresist 20 or other similar material that is compatible with plasma-etching techniques. The child wafer can be made of any substrate material which typically undergo etching. Typical substrate materials to be etched include, Silicon (transmission band 1100 nm–6,000 nm, refractive index=3.5), Fused silica (transmission band 190 nm–4,000 nm, refractive index=1.4), Gallium phosphide (transmission band 580 nm–1,600 nm, refractive index=3.1), Plastics (transmission band 400 nm to 1,600 nm, refractive index=1.4–1.6), Germanium (transmission band 2,000 nm–19,000 nm, refractive index=4.0), and Zinc Selenide (transmission band 700 nm–17,000 nm, refractive index=2.4). The discussion herein should not be interpreted to limit the substrate material that can be used in the invention.

Preparation of the child wafer 16 with photoresist 20 may include spin, spray or sheet based photoresist wafer preparation. The photoresist layer 20 will later aid in the etching of a pattern in the child wafer 16. In other words, a thin film of photoresist 20 is applied to the child wafer 16. An example of applying photoresist 20 entails placing a drop of liquid photoresist 20 onto a silicon wafer, then rapidly spinning the wafer to achieve a uniform thin coating of photoresist on the surface of the substrate. The photoresist 20 is then exposed to ultraviolet light through a gray scale mask. The photoresist 20 is then developed using known methods to produce an impression of the desired workpiece in the photoresist layer. The developed photoresist is then treated with ICP-machining or, alternately, by RIE followed by ICP-machining. The sheet-based process may be preferable as it appears to offer the most uniform and consistent layer thickness.

For the photoresist 20, a polyimide-based material is desirable due to its inherent "toughness" during the plasma-etch process. This allows the power and gas flow in the etcher to be increased, which tends to reduce the non-uniformities in the etch process. Other material which may have similar properties are epoxies, SU-8, etc.

Once the child wafer 16 is prepared, the electroformed nickel mold 18 shape is then transferred into the photoresist 20 or like material by direct contact, i.e. by compression molding, of the mold 18 and child wafer 16. The mold 18 and wafer 16 are then separated. The mold 18 shape can also be transferred to the photoresist 20 by loading the mold 18 into a vacuum-press (not shown) and evacuating the air from between the child wafer 16 and the mold 18.

Once the mold shape is transferred to the photoresist 20, the child wafer 16 is now ready for standard plasma etching techniques, for example. For standard RIE etching of gray-scale photoresist structures, the choice of process gases is dependent on the material being etched. For silicon, $SF_6$ and $O_2$ are typically used, although other gases can and are used depending of the application. Other process gases used include, but are not limited to $CF_4$ and $CHF_3$, which can also be mixed with $O_2$. The variation of process parameters allows a desired selectivity for the etch. Selectivity is defined as the etch rate of the photoresist versus the etch rate of the substrate. The ICP-machining method permits an etching rate of between 2 and 20 μm/min and a polymer layer that can be an approximately 50 nm thick TEFLON-like polymer (polytetrafluoroethylene-like polymer) layer. The polymerization step can be performed using a mixture of Ar and $CHF_3$. The etching step can be performed for a sufficient duration to attain an etching depth of approximately 2–3 μm. The ICP-machining method uses a plasma that can be generated using microwave energy at outputs between 300 and 1200W (2.45 GHz). During the etching steps, an ion bombardment with energies between 5 and 30 eV can be used so as to have the structure base completely free form deposits from the plasma.

Through the above mention method, each child wafer 16 has exactly the same photoresist shape as each and every other child wafer thereafter manufactured. The advantage of having identical child wafers is the elimination of photoresist outcome variations that are commonly associated with spin, expose and develop processes. In any case, the child wafer 16 can be dry etched, wet etched, or milled with standard process technology and the outcomes are solely dependent upon the etch process parameters.

Initially, the master wafer 10 may be made so as to compensate for photoresist (or photoresist-like) selectivity and plasma etch lead/lag characteristics. The objective for the master wafer 10 is to be able to incorporate all fixed error compensation required to yield an ideal etched child.

Figure 3:
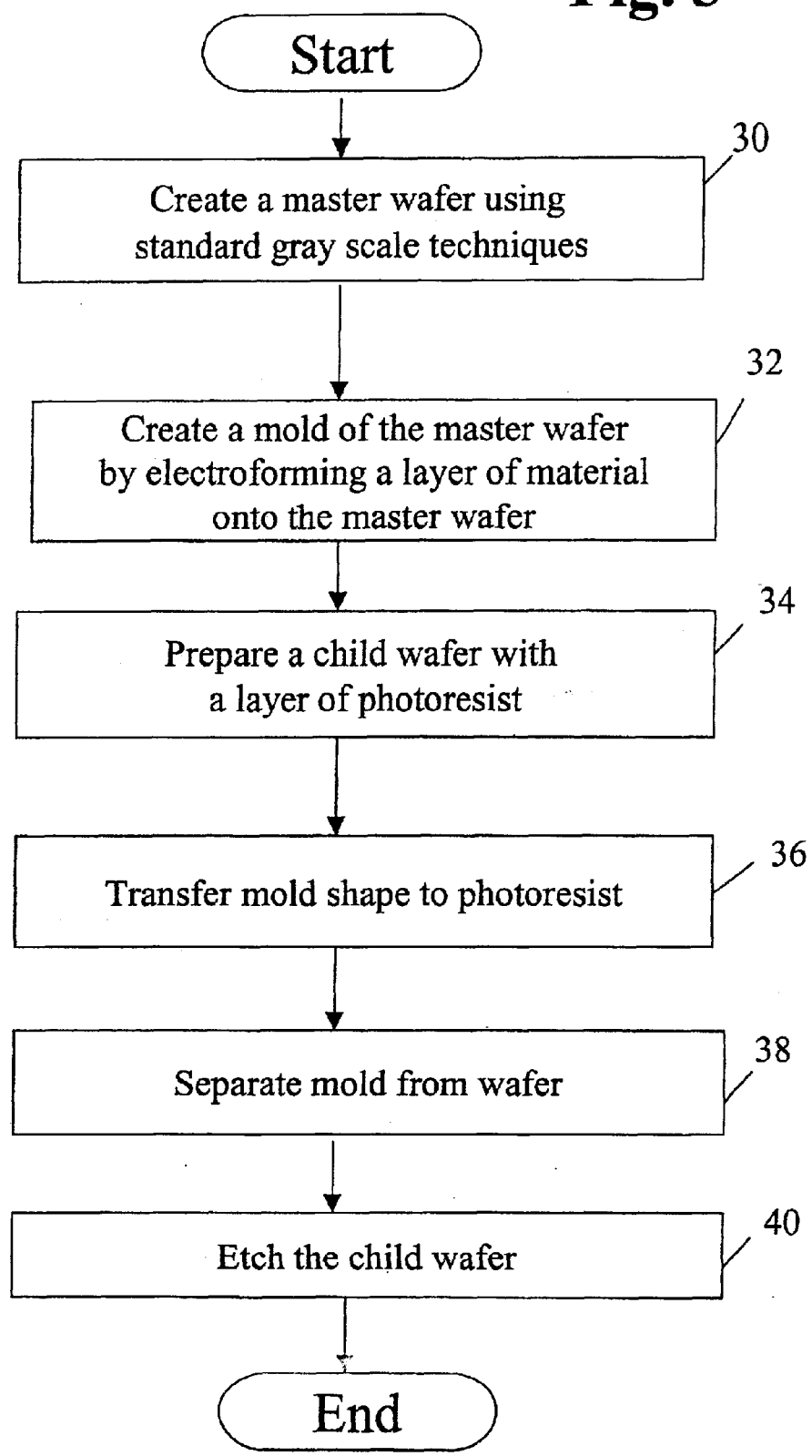
FIG. 3 illustrates a flow chart of the operations performed to replicate a wafer according to one embodiment of the present invention.

With reference to FIG. 3, the process for creating an analog replica of a master wafer is illustrated. The process starts at step 30 wherein a master wafer is created using standard grey scale techniques. Then, at step 32, the process creates a mold of the master wafer by electroforming a layer of material onto the master wafer.

At step 34, a child wafer is prepared with a layer of photoresist. Then, at step 36, the mold shape is transferred to the photoresist. At step 38, the mold is separated from the wafer. Then, at step 40, the child wafer is etched. Then the process ends.

Although preferred embodiments of the present invention have been described in detail herein, it should be understood that many variations and/or modifications of the inventive concepts herein taught still fall within the spirit and scope of the present invention.

What is claimed is:

1. A method of making an analog replica of a master wafer, comprising:

creating a mold by electroforming a layer of material on the surface of the master wafer, a mold surface of the master mold having a mold shape, the mold shape comprising at least one of a curved feature, a slanted feature, or multi-level feature, wherein the mold shape is substantially parallel to the master wafer;

preparing a child wafer with a layer of photoresist;

transferring the mold shape to the photoresist, separating the mold from the child wafer; and etching the child wafer.

2. The method of claim 1, wherein the electroforming a layer includes electroforming a layer of nickel on the surface of the master wafer.

3. The method of claim 1, wherein the mold shape is transferred to the photoresist by compression molding.

4. The method of claim 1, wherein the master wafer is a silicon wafer with a contour surface.

5. The method of claim 1, wherein the master wafer is glass, quartz, silicon, gallium phosphide, fused silica, plastic, germanium, zinc selenide, Cu, Al, ceramic, or gallium arsenide.

6. The method of claim 1, further comprising applying a release-aid layer to the master wafer prior to electroforming.

7. The method of claim 6, wherein the applying a release-aid includes applying a metal having a poor adhesion property to the master wafer.

8. The method of claim 6, wherein the release-aid layer is gold or Teflon.

9. The method of claim 1, wherein the photoresist is made from a negative photoresist material.

10. The method of claim 9, wherein the photoresist material is a polyimide-based material.

11. The method of claim 1, wherein the etching includes any one of plasma-etching, dry etching, wet etching or milled with standard process technology.

12. The method of claim 1, wherein the mold shape has at least one curved feature, the curve feature is convex, concave, or a combination thereof.

13. The method of claim 1, wherein the child wafer is glass, quartz, silicon, gallium phosphide, fused silica, plastic, germanium, zinc selenide, Cu, Al, ceramic, or gallium arsenide.

14. The method of claim 1, wherein the mold shape has at least one multi-level feature forming elevated steps.

15. The method of claim 1, wherein the photoresist material is made from a positive photoresist material.

16. The method of claim 15, wherein the photoresist material is novalak or a phenyl-formaldehyde resin.

* * * * *